US006312766B1

United States Patent
Pai et al.

(10) Patent No.: US 6,312,766 B1
(45) Date of Patent: Nov. 6, 2001

(54) ARTICLE COMPRISING FLUORINATED DIAMOND-LIKE CARBON AND METHOD FOR FABRICATING ARTICLE

(75) Inventors: Chien-Shing Pai, Bridgewater; Wei Zhu, Warren, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/205,840

(22) Filed: Dec. 4, 1998

Related U.S. Application Data
(60) Provisional application No. 60/077,720, filed on Mar. 12, 1998.

(51) Int. Cl.$^7$ ............................. C23C 14/48; C23C 14/06
(52) U.S. Cl. ...................... 427/523; 427/249.7; 427/525; 427/577
(58) Field of Search ...................... 427/523, 524, 427/525, 530, 562, 577, 249.7

(56) References Cited

U.S. PATENT DOCUMENTS

| | | | |
|---|---|---|---|
| 5,073,785 | * 12/1991 | Jansen et al. ........................ | 427/577 |
| 5,190,807 | * 3/1993 | Kimock et al. ..................... | 428/216 |
| 5,393,572 | * 2/1995 | Dearnaley ........................... | 427/523 |
| 5,547,714 | * 8/1996 | Huck et al. .......................... | 427/523 |
| 5,674,355 | 10/1997 | Cohen et al. ..................... | 156/652.1 |
| 5,679,269 | 10/1997 | Cohen et al. ........................ | 216/72 |
| 5,698,901 | 12/1997 | Endo .................................. | 257/758 |
| 5,949,612 | * 9/1999 | Gudeman et al. ............... | 360/97.01 |
| 6,030,904 | * 2/2000 | Grill et al. ......................... | 438/781 |
| 6,077,569 | * 6/2000 | Knapp et al. ....................... | 427/534 |
| 6,086,962 | * 7/2000 | Mahoney et al. ................... | 427/523 |

FOREIGN PATENT DOCUMENTS

| | | |
|---|---|---|
| 0751567A | 1/1997 | (EP) . |
| 363021209A | * 1/1988 | (JP) . |
| 4-265516 | 9/1992 | (JP) . |
| 11-330066A | * 11/1999 | (JP) . |

OTHER PUBLICATIONS

"Clipped Image" abstract of JP362153380 A, "Abrasive and Its Manufacture" by Hirochi et al, assignee Matsushita Electric Ind. Co. Ltd, Jul. 8, 1987.*

Matsubara, Y. et al., "Low–K Fluorinated Amorphous Carbon Interlayer Technology For Quarter Micron Devices", *IEEE,* IEDM 96, pp. 369–372 (1996). No Month.

Grill, A. et al., "Novel Low–K Dielectrics Based on DLC Materials", *Materials Science,* RC 20878 (92467), pp. 1–9 (1997). Jun.

Grill, A. et al., "Diamondlike Carbon Materials as Low–K Dielectrics for Multilevel Interconnects in ULSI", *Mat. Res. Soc. Symp. Proc.,* vol. 443, pp. 155–164 (1997). No Month.

Endo, K. et al., "Fluorinated Amorphous Carbon Thin Films Grown by Plasma Enhanced Chemical Vapor Deposition for Low Dielectric Constant Interlayer Dielectrics", Journal of App. Phys., 78(2), pp. 1370–1372 (1995). Jul. 15, 1995.

Amano, T. et al., Preparation of Fluorinated Amorphous Carbon (a–C:F) by Magnetron Sputtering, 58$^{th}$ Conf. On Applied Physics of Japan (1997). Oct. 2–5, 1997, abstract.

* cited by examiner

*Primary Examiner*—Marianne Padgett
(74) *Attorney, Agent, or Firm*—Scott J. Rittman

(57) ABSTRACT

Ion beam deposition, using a carbon- and fluorine-containing source or sources, is used to form a fluorinated diamond-like carbon layer in a device, the FDLC layer exhibiting a dielectric constant of 3.0 or less along with a thermal stability of at least 400° C. During the ion beam deposition, due to the unique nature of carbon chemistry, the carbon atoms combine at the substrate surface to form all possible combinations of $sp^1$, $sp^2$ and $sp^3$ bonds. However, ion beam etching occurs along with deposition, such that atoms of the weaker carbon structures—carbyne and graphite—are removed preferentially. This leads to a buildup of a diamond-like, $sp^3$-bonded structure with fluorine atoms, it is believed, substituted for some carbon atoms within the structure, this structure providing the desirable properties of the layer.

6 Claims, 4 Drawing Sheets

ARTICLE COMPRISING FLUORINATED DIAMOND-LIKE CARBON AND METHOD FOR FABRICATING ARTICLE

CROSS-REFERENCE TO RELATED APPLICATIONS

This application claims priority of Provisional Application Serial No. 60/077,720 which was filed on Mar. 12, 1998.

BACKGROUND OF THE INVENTION

1. Field of the Invention

This invention pertains to low dielectric constant fluorinated carbon materials.

2. Discussion of the Related Art

As device integration densities rise and circuit dimensions shrink, certain problems are encountered. For example, the smaller line dimensions increase the resistivity of the metal lines, and the narrower interline spacing increases the capacitance between the lines. This increased resistance and capacitance causes problems in propagation delay, crosstalk noise, and power dissipation. Moreover, as the device speed increases due to smaller feature sizes, the resistance-capacitance (RC) delay caused by the increased resistivity and capacitance will become the major fraction of the total delay (transistor delay+interconnect delay) limiting the overall chip performance. It is therefore desirable to reduce the effect of the increased resistance and capacitance in integrated circuit applications.

To address these problems, new materials for use as metal lines and interlayer dielectrics (ILD), as well as alternative architectures, have been proposed to replace the current Al(Cu) and $SiO_2$ interconnect technology. These alternative architectures will require the introduction of low dielectric constant ($\kappa<3$) materials as the interlayer dielectric and/or low resistivity conductors such as copper.

To implement low $\kappa$ materials to replace $SiO_2$, two basic approaches are being developed future backend-of-the-line (BEOL) interconnect architectures. The first is to improve the current process, in which Al(Cu) is first patterned, and then a low-$\kappa$ dielectric material is either (a) deposited over the entire substrate and planarized to the level of the metal wiring or (b) deposited directly next to the patterned lines.

The second approach is based on the damascene process, in which the metal is deposited into wiring channels patterned into a dielectric material. The damascene process is particularly well-suited for implementation of Cu metallization. A typical damascene process is reflected in FIGS. 1A–1C. Insulating layer 12 is deposited onto a previously deposited insulating substrate 10. As reflected in FIG. 1A, a photoresistive pattern 14 is formed on the insulating layer 12, and openings are then etched in the insulating layer 12. As shown in FIG. 1B, a conductive metal 16, e.g., aluminum, is then deposited in the trenches to form wiring, generally by sputtering or chemical vapor deposition. Upon planarization of the deposited metal 16, the steps are is repeated to form a multilayer structure, with metal vias 18 connecting the wiring 16, as shown in FIG. 1C. A so-called dual damascene process also exists. As reflected in FIGS. 2A–2C, the dual damascene process involves the simultaneous formation of a conductive via and a conductive wiring, and thus requires less steps than a single damascene process. Specifically, as shown in FIG. 2A, an insulating layer 22 is deposited on a previously deposited insulating substrate 20, and is then patterned by conventional photo-lithographic methods to form a first opening 24 that is the intended width of the via. As shown in FIG. 2B, a photoresist layer 26 is then deposited to form a second opening 28 that is the intended width of the wiring trench. Etching, typically reactive ion etching (RIE), is conducted to form the via and wiring trenches 30. As shown in FIG. 2C, a conductive metal 32 is then deposited by a method such as sputtering or chemical vapor deposition to simultaneously form the vias and wiring.

New low $\kappa$ materials desirably exhibit a variety of electrical, chemical, mechanical and thermal properties. These properties include low dielectric constant, high thermal stability, good adhesion, low stress, good mechanical strength, matched CTE (coefficient-of-thermal-expansion) with silicon, etchability and etch selectivity, low moisture absorption, high thermal conductivity, low leakage current, high breakdown strength, and manufacturability. A variety of materials have been proposed to meet some or all of these criteria. The materials are typically produced by chemical vapor deposition (CVD) or by spin-on coating. Materials produced by CVD include fluorinated $SiO_2$ glass ($\kappa=3.5$), fluorinated amorphous carbon, and polymers such as the parylene and polynaphthalene families, and polytetrafluoroethylene (PTFE) ($\kappa=2.7–3.5$ for nonfluorinated polymers and 1.8–3.0 for fluorinated polymers). Materials deposited by spin-on coating include organic polymers, inorganic polymers, inorganic-organic hybrids, and porous materials such as xerogels or aerogels. Organic materials typically offer lower dielectric constants than inorganic materials but exhibit disadvantageous properties such as low thermal stability, low mechanical strength, low resistance to oxygen plasma, and poor adhesion, and also tend to cause via poisoning.

Fluorinated amorphous carbon (a—C:F) has attracted particular attention recently as a promising candidate for low $\kappa$ ILD material. Amorphous C:F layers deposited by chemical vapor deposition techniques, using source compounds of hydrocarbons (such as $CH_4$, $C_2H_2$) and fluorocarbons (such as $CF_4$, $C_2F_6$, $C_4F_8$), have exhibited useful dielectric constants. In particular, a—C:F layers with a dielectric constants of 2.1 to 2.8 have been deposited with both parallel-plate plasma enhanced CVD and high density plasma (HDP) CVD. (See K. Endo and T. Tatsumi, *J. Appl. Phys.*, 78, 1370 (1995); Y. Matsubara et al., IEEE IEDM 1996, p. 14.6.1; A. Grill et al., *Mat. Res. Soc. Symp. Proc.*, Vol. 443, p. 155 (1997); and K. Endo and T. Tatsumi, *Appl. Phys. Lett.* 68, 2864 (1996).)

While the CVD process offers useful results, the process disadvantageously involves complicated chemistries due to the gases involved, requires elevated temperatures, and is prone to impurity and particle contamination caused by gas phase reactions. Moreover, the a—C:F layers produced by CVD exhibit poor adhesion on $SiO_2$, and therefore require an additional buffer layer to promote adhesion. The need for such a buffer layer results in higher manufacturing cost and more complications in device processing and operation. CVD a—C:F layers also contain hydrogen impurities due to the use of hydrocarbon sources (e.g., $CH_4$, $C_2H_2$). Such hydrogen impurities tend to degrade the usefulness of the resultant material by reducing the thermal stability, due to both the relative weakness of the C—H bond compared to the C—F bond, and the hydrogen's disruption of the C—C cross-linked structure. In addition, CVD is generally not adequate to provide much $sp^3$ bonded carbon, which provides desirable properties, but instead provides a substantial amount of layered, graphite-like $sp^2$ bonded carbon.

An attempt at a partial solution to these CVD-related problems is reflected in T. Amano et al., "Preparation of fluorinated amorphous carbon (a—C:F) by magnetron sputtering," 58th Conference on Applied Physics of Japan, 1997. The authors describe an essentially hybrid CVD/sputtering approach (reactive sputtering) in which a gaseous fluorine source and a solid carbon source are used to form the a—C:F layer. Such an approach addresses problems created by hydrogen impurities, but does not appear to address the other problems encountered with CVD processes.

Thus, fluorinated carbon layers are desired which exhibit low dielectric constant, high thermal stability, and high dielectric breakdown strength, along with other required properties.

SUMMARY OF THE INVENTION

According to the invention, ion beam deposition, using a carbon- and fluorine-containing source or sources, is used to form a fluorinated diamond-like carbon (FDLC) layer in a device, the FDLC layer exhibiting desirable dielectric properties and thermal stability. (Diamond-like carbon indicates a structure having a network of $sp^2$ and $sp^3$ bonded carbon atoms, where at least about 10% of the carbon-carbon bonds in the structure are $sp^3$ bonds (as determined by NMR or Raman spectroscopy). Ion beam deposition is discussed generally in J. Harper, "Ion Beam Deposition" (Ch. II-5), *Thin Film Processes*, J. Vossen et al., eds., Academic Press, 1978, the disclosure of which is hereby incorporated by reference. The use of ion beam deposition to form diamond-like carbon is discussed, for example, in S. Aisenberg and R. Chabot, *J. Appl. Phys.*, Vol. 42, 1971, at 2953 ; and E. Spencer et al., *Appl. Phys. Lett.*, Vol. 29, 1976, at 118, the disclosures of which are hereby incorporated by reference. Layer indicates that the material is present as a continuous or discontinuous layer in a device. Thermal stability indicates a temperature at which a material will exhibit less than 5 wt.% loss after 10 minutes of exposure.) The invention thereby provides an article having a FDLC layer exhibiting a dielectric constant of 3.0 or less, advantageously 2.5 or less, along with a thermal stability of at least 400° C., advantageously 450° C.

The advantageous properties of the FDLC structure produced by ion beam deposition are a result of the highly dynamic state of the growing layer, which experiences a combination of deposition and sputtering due to the bombardment by energetic carbon and fluorine ions and also due to the resulting transfer of kinetic energy and momentum that stimulates diffusion processes, phase transitions and chemical reactions at the layer surface. Specifically, in the ion beam deposition process, a carbon- and fluorine-containing ion beam or beams of controlled composition, energy and flux is directed onto the substrate. Due to the unique nature of carbon chemistry, the carbon atoms combine at the substrate surface to form all possible combinations of $sp^1$, $sp^2$ and $sp^3$ bonds. For example, allotropes of carbyne are formed as unstable linear chains with carbon $sp^1$ bonds, hexagonal graphite is formed with planar $sp^2$ bonds, and tetrahedral $sp^3$ bonding results in the formation of diamond-like structure. During the energetic ion beam deposition, ion beam etching occurs along with deposition. Atoms of weaker carbon structure, particularly carbyne, along with some graphite (and a variety of physisorbed residual gases and impurities) are removed preferentially, leading to increased amounts of diamond-like $sp^3$ structure, with, it is believed, fluorine atoms substituted for some carbon atoms within the structure.

An important aspect of the ion beam deposition process is the use, under high vacuum conditions, of broad ion beams of well defined energy and narrow energy spread. Unlike deposition from neutral particles (such as sputtering), deposition from charged particle beams offers the important advantage of direct control over the deposition energy, which allows for adjustment in the species energy, depending on the desired layer structure and properties. Additionally, the incident ion energy spread is narrower (less than 10 eV) in the ion beam process than that obtained under conventional plasma deposition conditions (typically~100 eV), as shown schematically in FIG. 3. A narrow beam energy spread is important for obtaining an $sp^3$ bonded, crosslinked structure. Specifically, species arriving at relatively low energies tend to physisorb and their energies and mobility are insufficient to overcome the energy barrier to form the diamond phase, resulting in weaker carbon structures. On the other hand, species arriving at relatively high energies will desorb, re-sputter and even cause structural damage and degradation to the growing film surface, again leading to more defective and graphitic films. At more intermediate energies (the exact value is sensitive to process chemistry and other parameters), the species are expected to have sufficient energies (beyond that necessary for dissociation and chemisorption) to form an $sp^3$ structure and nudge the atoms into appropriate lattice sites, but not so high as to damage the forming layer.

In addition, unlike CVD and sputtering processes, the substrate in ion beam deposition is essentially isolated from the ion generation process. This enables greater flexibility in controlling and optimizing the process parameters, such as the substrate temperature, gas pressure, angle of deposition and the type of particle bombardment of the growing film, as well as allowing independent control over the ion beam current and energy. Also, because of the isolation of the substrate from the plasma, the substrate is not subjected to bombardment by high energy electrons, and interaction with radiation from the plasma is reduced. The net result is a reduced substrate temperature for ion beam deposition compared with CVD plasma methods. The ion beam deposition also takes place at a lower pressure (e.g., about $10^{-4}$ to about $10^{-5}$ torr) compared to conventional CVD and sputtering techniques (which are performed at about $10^{-3}$ torr). The reduced deposition pressure helps reduce pinholes in the film structure (which are detrimental to leakage current and breakdown strength), as well as particle generation and contamination. The lower pressure of ion beam deposition also reduces gas collision with ions traveling on the way to the substrate, such collisions undesirably lowering the ion energy impacting the film surface.

The invention therefore provides an improved process for preparing a device containing a low dielectric constant fluorinated carbon material, where the layer exhibits a variety of properties important to good device performance, including low dielectric constant, high thermal stability, high breakdown field, and low leakage current.

DETAILED DESCRIPTION OF THE INVENTION

In order to form low dielectric constant (κ), fluorinated carbon material which is also thermally stable, it is desirable to enhance the three-dimensional crosslinking of C—C bonds in a tetrahedrally bonded diamond-like structure. According to the invention, an $sp^3$ bond-containing thin film structure, in which at least about 10% of the carbon bonds are $sp^3$ bonds, is obtained by ion beam deposition using a carbon- and fluorine- containing ion source or sources. The incorporation of fluorine atoms into such ion beam deposited DLC structure results in a relatively low κ material with desirable thermal stability and electrical properties.

In the ion beam deposition process, an ion beam or beams of controlled composition, energy and flux are directed onto the substrate (as used herein, substrate indicates any surface onto which the FDLC layer is deposited). The carbon atoms combine at the substrate surface to form all possible combinations of $sp^1$, $sp^2$ and $sp^3$ bonds. During the ion beam deposition, simultaneous ion beam etching occurs, during which atoms of weaker structures (as well as other physisorbed residual gases and impurities) are removed preferentially, leading to more diamond-like $sp^3$ structure. Relatively high energy ion bombardment (40–500 eV) provides a desirable level of such etching, simultaneously with the deposition, the etching resulting in a hard, insulating FDLC film suitable for demanding VLSI interconnect applications. The degree of ion bombardment appears to have a direct relationship to the $sp^3$ fraction of bonding in the FDLC films. The FDLC layers of the present invention are typically composed of a mixture of $sp^3$ and $sp^2$ bonded carbon, with the concentration of $sp^3$ bonded carbon typically in the range of about 10 to about 50% of the total carbon bonds, advantageously about 20 to about 50%.

The structure of the fluorinated diamond like carbon films produced from ion beam deposition is different from fluorinated amorphous carbon (a—C:F) films produced by CVD or sputtering in that the FDLC films of the invention contain at least about 10% $sp^3$ bonded carbon in its three-dimensional, cross-linked network structure with, it appears, fluorine atoms substituting for some of the carbon atoms. The a—C:F films, by contrast, typically contain greater than 90% $sp^2$ and $sp^1$ bonded amorphous structure.

Figure 1A:
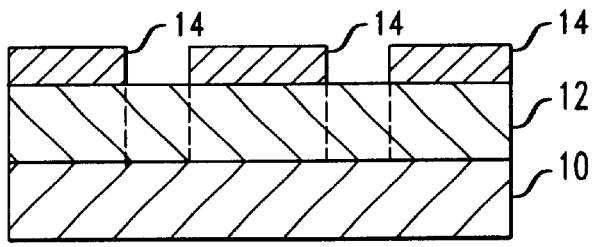
FIGS. 1A–1C illustrate a damascene process.
Figure 1B:
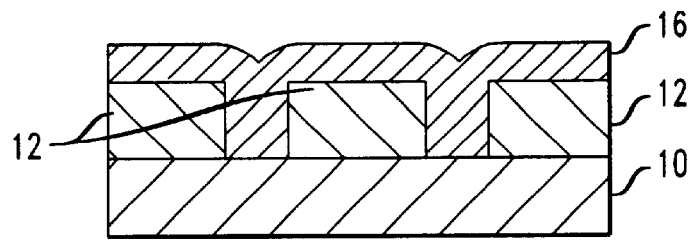
Figure 1C:
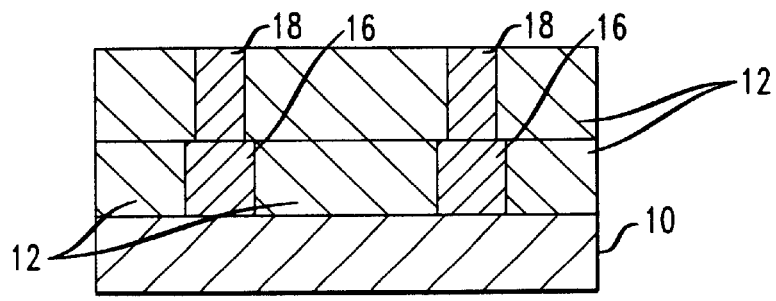
Figure 2A:
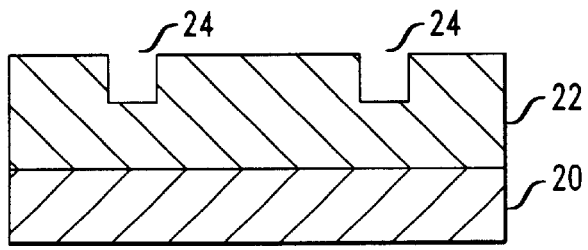
FIGS. 2A–2C illustrate a dual damascene process.
Figure 2B:
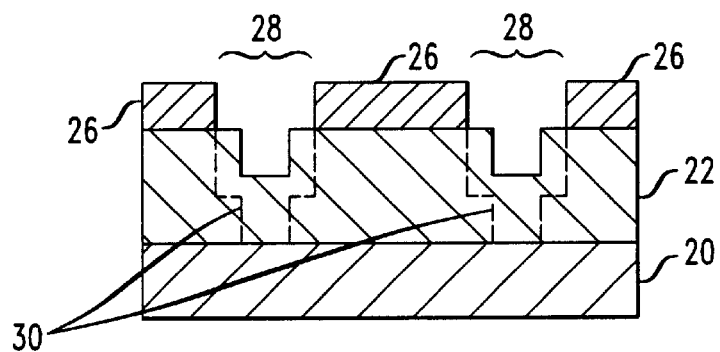
Figure 2C:
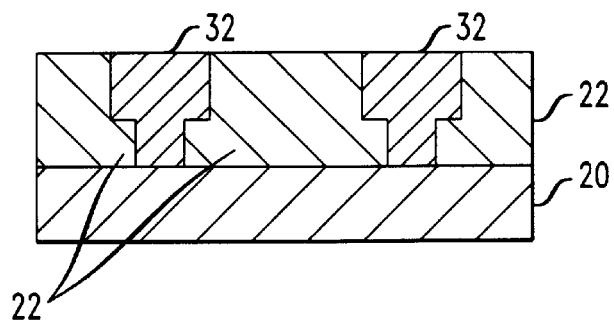
Figure 3:
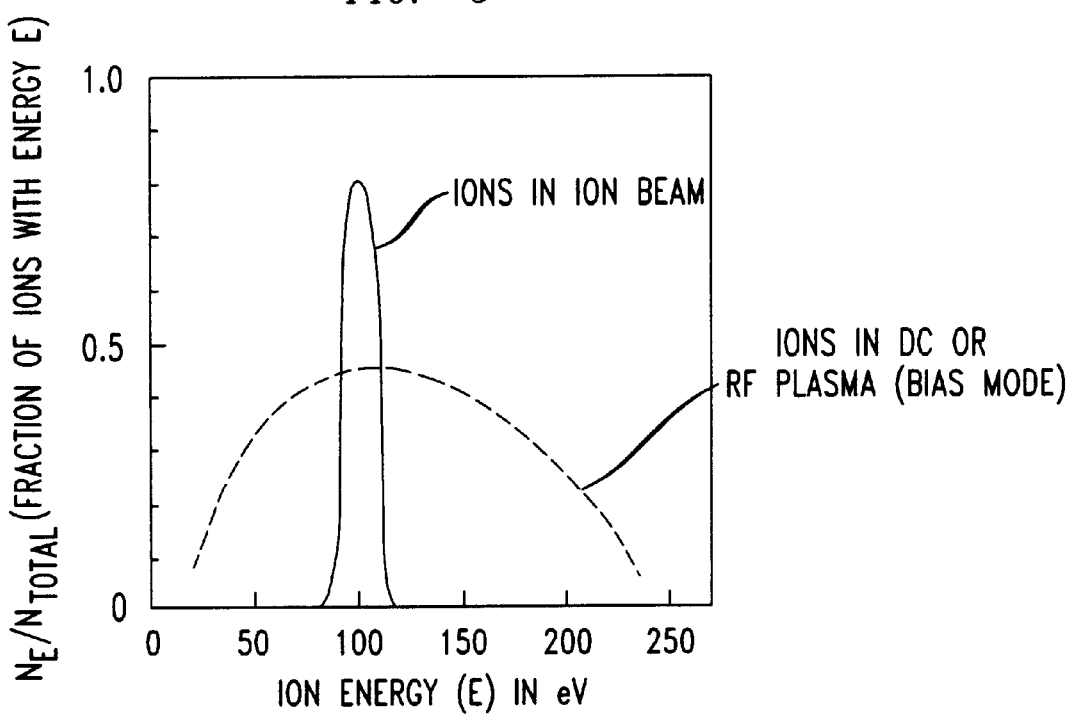
FIG. 3 illustrates the distinction between the ion energy spread in ion beam deposition versus plasma deposition process.
Figure 4:
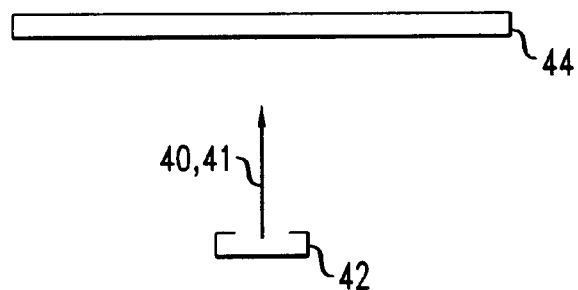
FIG. 4 illustrates one embodiment of the invention.
Figure 5:
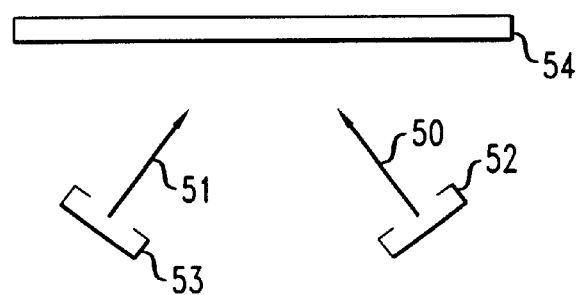
FIG. 5 illustrates an additional embodiment of the invention.
Figure 6:
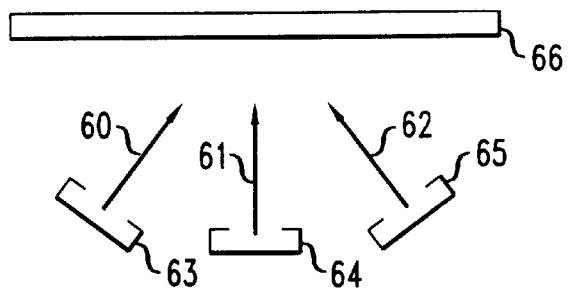
FIG. 6 illustrates a further embodiment of the invention.
Figure 7:
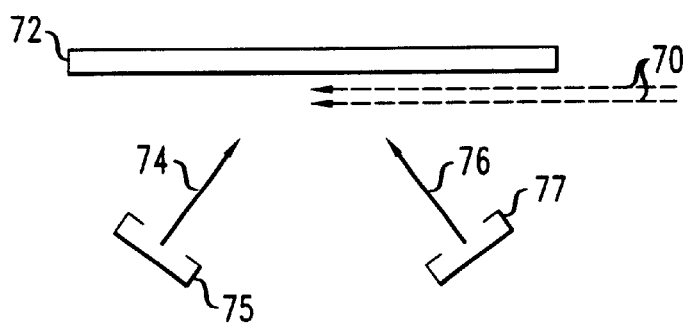
FIG. 7 illustrates another embodiment of the invention.

The FDLC layer is deposited, e.g., as an interlayer dielectric, by ion beam deposition by using both carbon-containing ions and fluorine-containing ions. These ions are capable of being generated from either gaseous sources (such as hydrocarbons, halocarbons), liquid sources (such as benzene), or solid sources (such as graphite, fluoropolymers) using suitable ion sources, such as a Penning ion source, Kaufman type source or the duoplasmatron source (see, e.g., J. Harper, "Ion Beam Deposition (Ch. II-5)," *Thin Film Processes*, J. L. Vossen and W. Kern, eds., Academic Press, 1978.) As reflected in FIG. 4, the carbon-containing ions and fluorine-containing ions 40, 41 directed at a substrate 44 are capable of being produced from the same ion source 42 by, for example, feeding a mixture of corresponding carbon- and fluorine-containing gases into the ion source 42. It is also possible to produce, and direct at a substrate 54, carbon ions 50 and fluorine ions 51 separately, with distinct carbon ion and fluorine ion sources 52, 53, as shown in FIG. 5. As shown in FIG. 6, in addition to the fluorine and carbon ions 63, 65 (from sources 60, 62), it is possible to direct at the substrate 66 a third set of ions 61 from another source 64, typically an inert gas such as $Ar^+$ or $Kr^+$. This third set of ions 61 provide further ion beam bombardment to assist attainment of the $sp^3$-containing structure. Another variation, reflected in FIG. 7, is the use of reactive ion beam deposition, in which the fluorine is introduced as a fluorine-containing gas 70 directly into the incoming carbon-containing ion beam 74 (from source 75), near the substrate 72 surface. Optionally, in the embodiment of FIG. 7, a third source 77 directs ions 76 (generally inert gas) at the substrate 72 to provide additional bombardment, since the fluorine bombardment is absent. It is also possible in the embodiment of FIG. 7 to direct a fluorine-containing ion beam into a carbon-containing gas.

It is also possible in the invention to use ion beam techniques such as single or dual ion beam sputtering deposition, ion beam plating, and cluster ion beam deposition to deposit a FDLC layer. See, e.g., C. Weissmantel et al., *Thin Solid Films*, Vol. 63, 315 (1979), the disclosure of which is hereby incorporated by reference. Another technique is ionized plasma sputtering—a high-pressure (>10 mtorr) sputtering process in which the sputtered atoms pass through an externally coupled plasma (e.g., RF inductive coupling) between the target and substrate, become ionized therein, and subsequently deposit onto the substrate. The substrate is optionally biased to provide further control over the arriving ion flux and energy.

For a given chemical composition of a hydrocarbon/halocarbon ion beam, it is possible to generate FDLC films with a wide variety of properties by changing the ion impact energy. For example, the film hardness generally reaches a maximum at an ion energy of several hundred electron volts. Depending on the specific properties and application requirements, a balance of ion energy, flux and beam composition is therefore selected. The ion energy generally ranges between 10 eV and 1,500 eV, typically 50–500 eV, and more typically 40–300 eV. The ion energy spread is generally less than 50 eV and more typically less than 10 eV. The operating pressure is typically in the range of about $10^{-5}$ to about $10^{-4}$ torr.

The physical and chemical properties of the FDLC layer are largely dictated by the composition and structure. For example, the value of the dielectric constant relates to the polarizability of a material and is therefore strongly dependent on the chemical structure. It is believed that fluorine substitution into an otherwise pure carbon or hydrocarbon structure lowers κ by decreasing the polarizability and moisture absorption and free volume. Specifically, the formation of C—F bonds is believed to decrease the electronic polarizability due to strong electron-withdrawing inductive effects from the fluorine atoms. Thus, the higher the fluorine concentration, the lower the dielectric constant. The FDLC layers produced according to the invention should exhibit dielectric constant values, at 1 MHz and room temperature (about 25° C.), of 3.0 or less, advantageously 2.5 or less.

Introducing porosity into the FDLC layers also contributes to lower dielectric constant. Specifically, increased porosity assists in lowering the dielectric constant by introducing air, which has a dielectric constant of about 1. Advantageously, the FDLC layer is provided with a porosity of about 10 vol. % or greater, more advantageously about 20 vol. % or greater. The average pore size in a layer having enhanced porosity (i.e., about 10 vol. % or greater porosity) is typically no more than 30 nm, advantageously no more than 10 nm. The dielectric constant in an enhanced porosity layer is typically at least 5% lower, advantageously at least 15% lower, than a FDLC layer with less than 3 vol. % porosity. It is possible to modify the ion beam deposition process discussed previously to obtain such porosity. In one embodiment, the substrate is cooled, e.g., below −100° C., advantageously below −180° C. (typically with liquid nitrogen), to slow mobility of the carbon and fluorine atoms upon their impact on the substrate. Reducing the atoms' mobility inhibits the atoms from arranging themselves in an ordered manner, thereby providing increased porosity. Alternatively, the ion source or sources are arranged at shallow angles to the substrate such that surface features on the substrate, e.g., local surface protrusion of a grain structure, essentially block some of the atoms, thereby inhibiting orderly arrangement of the impacting atoms. Advantageously, this shallow angle (referred to herein as the ion beam angle) is less than about 10° to provide such porosity. (The ion beam angle is determined by the intersection of best-fit lines of the substrate surface and the direction of the ion beam.)

The substantial absence of hydrogen is also significant to the properties of the FDLC layer of the invention. Specifically, hydrogen detrimentally affects both the mechanical strength and thermal stability of the layers by suppressing C—C crosslinking bonds and forming relatively weak C—H bonds (as compared to C—F bonds). The FDLC layer of the invention typically contains less than 10 atomic percent hydrogen, advantageously less than 5 at %, and more advantageously less than 1 at %. With such a low concentration of hydrogen, the process of the invention should provide thermal stability of at least 400° C., advantageously 450° C. Such thermal stability values are desired to improve the FDLC layer's endurance of a typical BEOL integration process. However, too high a fluorine concentration will lower the material's thermal stability, because excessive fluorine atoms decrease the amount of the strong, C—C crosslinked network, thus making the material less useful in a BEOL process. A balance between dielectric constant and thermal stability must therefore be made. In addition, a bandgap in the FDLC greater than 2.5 eV is desirable for attaining high breakdown and low leakage. This relatively high bandgap is possible due primarily to the presence of the $sp^3$ bonds. This bandgap will tend to provide a material with a desirably high breakdown field, e.g., about 1 MV/cm or higher, and a desirably low leakage current, e.g., about 1 nA/mm$^2$ or less.

The invention is capable of forming a FDLC layer exhibiting a relatively low stress of about 100 MPa or less in absolute value (as measured by laser scanning of a substrate curvature before and after formation of the layer, according to conventional techniques), because the ion beam deposition process allows manipulation of the energy of the ions bombarding the surface. This manipulation allow influence of the stress buildup of the layer. Low stress improves adhesion, e.g., to substrates such as Si, $SiO_2$, Al, TiN, and glass, by reducing the tendency of a layer to delaminate from such substrates. As the fluorine concentration is increased, the stress tends to decrease (thereby improving adhesion). Particularly low stresses are obtained at about 40 at % fluorine or higher, but, as mentioned previously, higher levels of fluorine tend to unacceptably decrease thermal stability. In addition to fluorine concentration, adjusting the power to the target or targets will tend to change the stress state, due to the power's effect on deposition rate. The thickness of FDLC layers in a device is typically in the range of 0.2–1.5 μm, more typically 0.4–1.2 μm.

To obtain a combination of desirable properties, fluorine is present in the FDLC layer in an amount ranging from 20 to 60 at %, advantageously 30 to 50 at %, with less than 10 at % hydrogen, advantageously less than 5 at % hydrogen, more advantageously less than 1 at % hydrogen. The combination of properties desired will vary depending on the particular use of the FDLC layer. More than about 60 at % fluorine is generally undesirable from a thermal stability standpoint.

Figure 8:
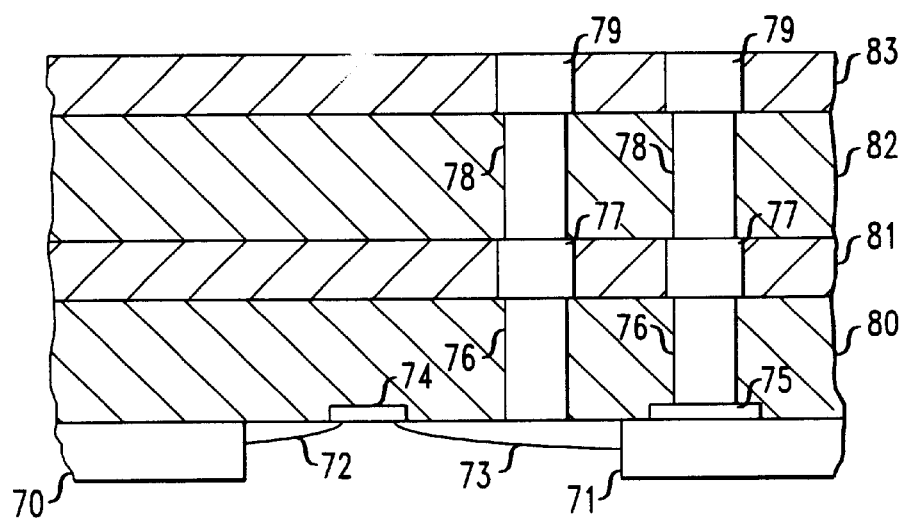
FIG. 8 illustrates a partial device structure according to the invention.

The FDLC layers of the invention are useful as a low dielectric constant material in a variety of integrated circuit applications, including damascene processes, as discussed above. It is possible to substitute the FDLC for presently-used low dielectric constant materials, e.g., silicon dioxide or nitrides, or to use the FDLC in combination with other low dielectric constant materials. For example, as reflected in FIG. 8, a partial device structure contains FDLC layers 81, 83 (optionally, layers 80 and 82 are also formed from FDLC or another insulating material such as $SiO_2$), in which are located windows 76, wiring 77, 79 and vias 78. The structure also contains field oxides 70, 71, a source 72 and drain 73, and gates 74, 75. Other useful device structures will be apparent to those skilled in the art from the description provided herein.

Other embodiments of the invention will be apparent to those skilled in the art from consideration of the specification and practice of the invention disclosed herein.

What is claimed is:

1. A process for forming a device, comprising the step of depositing on a substrate a fluorinated diamond-like carbon layer by ion beam deposition, wherein the substrate is cooled to less than −100° C. during deposition to provide the layer with at least 10 volume percent porosity.

2. The process of claim 1, wherein the layer comprises 20 to 60 atomic percent fluorine and less than 10 atomic percent hydrogen.

3. The process of claim 2, wherein the layer exhibits a dielectric constant of 3.0 or less at 1 MHz and room temperature.

4. A process for forming a device, comprising the step of depositing on a substrate a fluorinated diamond-like carbon layer by ion beam deposition, wherein an ion beam angle for at least one ion source is less than 10° to provide the layer with at least 10 volume percent porosity.

5. The process of claim 4, wherein the layer comprises 20 to 60 atomic percent fluorine and less than 10 atomic percent hydrogen.

6. The process of claim 5, wherein the layer exhibits a dielectric constant of 3.0 or less at 1 MHz and room temperature.

\* \* \* \* \*